United States Patent
Omura et al.

(10) Patent No.: US 7,009,109 B1
(45) Date of Patent: *Mar. 7, 2006

(54) CASING STRUCTURE FOR ELECTRONIC EQUIPMENT

(75) Inventors: Hiroyoshi Omura, Osaka (JP); Hiroaki Ohashi, Osaka (JP)

(73) Assignee: Kyocera Mita Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/161,655

(22) Filed: Aug. 11, 2005

Related U.S. Application Data (63) Continuation-in-part of application No. 10/941,928, filed on Sep. 16, 2004.

(30) Foreign Application Priority Data

Sep. 24, 2003 (JP) .............................. 2003-331534

(51) Int. Cl.
*H02G 3/08* (2006.01)

(52) U.S. Cl. ........................... 174/50; 174/60; 174/64; 174/58; 439/535; 220/4.02

(58) Field of Classification Search .................. 174/50, 174/58, 60, 64, 63, 17 R; 220/4.02, 3.6, 220/3.8; 248/906; 439/535
See application file for complete search history.

(56) References Cited

U.S. PATENT DOCUMENTS 6,362,422 B1 * 3/2002 Vavrik et al. ................. 174/50
6,498,293 B1 * 12/2002 Marchand et al. ............ 174/50
6,737,577 B1 * 5/2004 Liao et al. .................... 174/50
6,740,809 B1 * 5/2004 Vacheron ...................... 174/50
6,809,258 B1 * 10/2004 Dang et al. ................... 174/50
6,930,249 B1 * 8/2005 Chen et al. ................... 174/50

FOREIGN PATENT DOCUMENTS

| JP | A-H05-307282 | 11/1993 |
| JP | A-H06-105080 | 4/1994 |
| JP | A-H06-291485 | 10/1994 |
| JP | A-H08-190237 | 7/1996 |
| JP | A-2002-237915 | 8/2002 |

* cited by examiner

*Primary Examiner*—Dhiru R. Patel
(74) *Attorney, Agent, or Firm*—Shinjyu Global IP (57) ABSTRACT

A casing structure for electronic equipment is disclosed that allows electronic equipment to be easily assembled while providing sufficient electromagnetic wave shielding effects, and which allows the manufacture of electronic equipment at a low cost. The casing structure includes a case member having an opening, and an electronic equipment support member. The electronic equipment support member is mounted in an opening periphery of the case member, and has an opening shielding portion that closes the opening and a mounting periphery that is bent from the opening shielding portion to extend along the opening periphery. With the electronic equipment support member, the angle formed between the opening shielding portion and the mounting periphery is an angle that is 90 degrees or greater. In addition, at least one portion of the mounting periphery includes a connection periphery, and the connection periphery is in direct contact with the opening periphery of the case member and electrically connected therewith when the electrical equipment support member is mounted in the case member.

7 Claims, 10 Drawing Sheets

CASING STRUCTURE FOR ELECTRONIC EQUIPMENT

CROSS-REFERENCE TO RELATED APPLICATION

This patent application is a continuation-in-part of U.S. patent application Ser. No. 10/941,928 filed Sep. 16, 2004.

BACKGROUND OF THE INVENTION

1. Field of the Invention

The present invention relates to a casing structure for electronic equipment that has the effect of shielding electromagnetic waves. More particularly, the present invention relates to a casing structure for electronic equipment that has the effect of shielding electromagnetic waves by means of electrical grounding between a case member and an electronic equipment support member that serves to support electronic boards and the like when the electronic equipment support member is mounted in the case member 2. Background Information Due to improvements in electronics technology, the use of electronic equipment, consumer electronics, communications equipment, and the like are becoming increasingly common in our daily lives. However, these devices continually generate electromagnetic waves when electrical power is supplied to them. In particular, the increase in the speed of the process and the colorization in recent image forming devices (e.g., digital copying machines, printers, and the like) is one cause of many of the electromagnetic waves generated by various devices arranged inside an image forming device. The electromagnetic waves generated by these devices are capable of having an adverse impact on other circuits in the devices and on other external electronic equipment, and thus there is a need to prevent the exterior leakage of electromagnetic waves to the greatest degree possible.

Control at a high clock frequency is needed in order to increase the speed of the process in an image forming device. When this occurs, strong electromagnetic waves may be generated from the control board or the like that generates the high clock frequency. For example, with a digital copying machine, multiple overlap of signal forms that are synchronized with the clock frequency will occur due to the relationship between high speed original document scanning and image formation when these are simultaneously performed, and thus will cause even stronger electromagnetic radiation. In addition, with recent color copying machines and printers, electromagnetic waves in an even higher frequency band may be generated at a high intensity due to the overlap of the clock frequency of a charge coupled device control board that is color separated into at least four colors, the increase in speed, and the improvement in image quality (high density pixels). Because of these issues, countermeasures against the strong electromagnetic waves that leak from image forming devices are in urgent demand. For example, electromagnetic wave shielding for the leakage of electromagnetic waves in the 30 to 230 MHz range is now being studied by groups such as the Voluntary Control Council of Japan For Interference By Information Technology Equipment (VCCI). However, the countermeasures for the electromagnetic wave shielding must respond to recent demands for lower cost equipment, and thus it is desirable that the electromagnetic wave shielding maintain superior electromagnetic wave shielding effects while performing the shielding with the most inexpensive means possible.

Various types of electromagnetic shielding for electronic equipment have been tried in the past. One example of these is a conductive flexible member that is attached to an image forming device as a grounding member (see, for example, Japanese unexamined patent application publication H5-307282). With Japanese patent application publication H5-307282, one end of the conductive flexible member is attached to the main portion of the electronic equipment with a screw, and when the electronic equipment is grounded, the plate spring effect of the flexible member will be used to press the other end of the flexible member to be in contact with another member.

In another example, an elastic conductive member is used as an electromagnetic shielding material, and attached to the contact portions between the support members and frame of electronic equipment to prevent the leakage of electromagnetic waves (see, for example, Japanese unexamined patent application publication H6-291485). With Japanese unexamined patent application publication H6-291485, a conductive sponge is adhered to the contact portions between the support members and case member with a double-sided adhesive tape, the portions of the support members and the case member that are out of range of the adhesive area of the double-sided adhesive tape are brought into contact with each other, and the electrical contact of both is thereby achieved.

In another example, an image reading device in which the end portions of a board are bent, and contact pressure is produced on the decorative case of a device during board mounting in order to perform grounding (see, for example, Japanese unexamined patent application publication H6-105080).

In addition, other examples include an image forming device in which 2 units are brought into contact via a conductive elastic member (see, for example, Japanese unexamined patent application publication H8-190237), and a structure in which a shielding cover covers the upper portion of an electromagnetic noise generation source (see, for example, Japanese unexamined patent application publication 2002-237915).

However, with the grounding configuration of the image forming device that is disclosed in Japanese unexamined patent application publication H5-307282, it will be necessary to newly provide a grounding member for electromagnetic shielding in the image forming device, and it will also be necessary to fix the grounding member in the image forming device with a large number of screws or the like. Because of this, the number of parts and steps needed during the assembly of the grounding structure of the image forming device disclosed in this reference will increase, the assembly efficiency of the image forming device will worsen, and manufacturing costs will increase.

With the electromagnetic wave prevention device disclosed in Japanese unexamined patent application publication H6-291485, double-sided adhesive tape is employed to fix the conductive sponges, but even with this construction, a new and separate member for electromagnetic wave shielding is fixed with a fixing means (double-sided tape), and thus the previously noted problems of worsened assembly efficiency due to the increase in the number of parts and assembly steps, and the increase in manufacturing costs, will not be solved.

With the image reading device disclosed in Japanese unexamined patent application publication H6-105080, if there is an increase in emission waves from the board, the equipment inside the device will malfunction due to this increase, the ends of the board will become antennas, and electromagnetic waves will be easily emitted to the exterior of the device. Furthermore, with Japanese unexamined patent application publication H6-105080, although electrical connectivity is achieved by bending the ends of the board, the opposite sides of the bend portions are fixed with screws, and thus this construction cannot contribute to the elimination of parts and a simplified assembly.

Furthermore, even with the devices of Japanese unexamined patent application publication H8-190237 and Japanese unexamined patent application publication 2002-237915, there will be problems with the ease of assembly, the cost aspect, and the workability thereof, and thus there is a great deal of room for improvement.

Thus, an object of the present invention is to take these problems into consideration, and provide a casing structure for electronic equipment in which the assembly of the electronic equipment is simplified while providing both a grounding effect and an electromagnetic wave shielding effect, and in which the low cost manufacture of the electronic equipment can be achieved.

SUMMARY OF THE INVENTION

A casing structure for electronic equipment according to a first aspect of the present invention includes a case member having an opening, and an electronic equipment support member. The electronic equipment support member will cooperate with the case member to achieve an electromagnetic wave shielding effect. The electronic equipment support member is mounted in an opening periphery of the case member, and has an opening shielding portion that closes the opening and a mounting periphery that is bent from the opening shielding portion to extend along the opening periphery. With the electronic equipment support member, the angle formed between the opening shielding portion and the mounting periphery is 90 degrees or greater. In addition, at least one portion of the mounting periphery includes a connection periphery, and the connection periphery is in direct contact with and electrically connected to the opening periphery of the case member when the electrical equipment support member is mounted in the case member. The aforementioned objects can be achieved by forming the casing structure for electronic equipment in this way.

With this casing structure, because the angle formed between the opening shielding portion and the mounting periphery of the electronic equipment support member is 90 degrees or greater, when the electronic equipment support member is mounted on the opening periphery of the casing, both will be in press-contact with each other. Thus, fixing means such as screws and the like need not be employed, and even if employed, the electronic equipment support member can be fixed to the case member with the minimum number of fixing means needed. In addition, because the aforementioned mounting periphery has a connection periphery that is in direct contact with and electrically connected to the opening periphery of the case member, the configuration can be simplified while obtaining a secure grounding effect and an electromagnetic wave shielding effect, and the manufacture of electronic equipment can be performed at low cost because the number of parts and assembly steps are reduced.

With the casing structure for electronic equipment according to a second aspect of the present invention, the casing structure of the first aspect is formed so that the mounting periphery includes a connection periphery and a periphery separation portion. The periphery separation portion is arranged so as to have a gap between the periphery separation portion and the opening periphery that is within a range that can shield electromagnetic waves when the electrical equipment support member is mounted in the case member. In addition, the connection periphery is bent outward from the opening shielding portion toward the exterior of the case member.

With this casing structure, because the mounting periphery includes a connection periphery that is bent outward from the opening shielding portion toward the exterior of the case member and a periphery separation portion, the layout for the grounding between the case member and the electronic equipment support member can be designed so as to conform to and be optimized for the electromagnetic wave shielding characteristics and the shape of the case member that are required by the electronic equipment, and thus the assembly of the case member and the electronic equipment support member can be simplified.

With the casing member for electronic equipment according to a third aspect of the present invention, the casing structure of the second aspect is formed so that the periphery separation portion is bent inward from the opening shielding portion toward the interior of the case member.

With this casing structure, because the periphery separation portion will become an antenna, and the electromagnetic waves can be emitted toward the interior of the case member, unnecessary electromagnetic waves can all be absorbed inside the case member, and leakage to the exterior of the case member can be further reduced.

With the casing structure for electronic equipment according to a fourth aspect of the present invention, the casing structure of the first aspect is formed so that the entire mounting periphery will become the connection periphery.

With this casing structure, because the entire mounting periphery is formed by the connection periphery, the connection between the electronic equipment support member and the case member can be made more secure, and a stronger electromagnetic wave shielding effected can be obtained.

With the casing structure for electronic equipment according to a fifth aspect of the present invention, the casing structure of the first aspect is formed so that the opening of the case member will be formed into a rectangular shape. In addition, the opening shielding portion that closes the opening is formed into a rectangular shape. Then, the mounting periphery is arranged on at least two sides of the opening shielding portion.

With this casing structure, an electronic equipment support member having an opening shielding portion in a standard rectangular shape can be adopted. Furthermore, because the mounting periphery is arranged on at least two sides of the opening shielding portion, a simplified configuration, correct positioning of the electronic equipment support member, a secure connection, and superior electromagnetic wave shielding can be achieved in general-purpose electronic equipment.

With the casing structure for electronic equipment according to a sixth aspect of the present invention, the casing structure of the first aspect is formed so that the angle is between 90 degrees and 100 degrees.

With this casing structure, because the mounting periphery of the electronic equipment support member is pressed into the casing member when mounting is completed, fixing means such as screws and the like need not be employed, and even if employed, the electronic equipment support member can be securely fixed with the minimum number of fixing means needed. Also, when the mounting periphery is pressed into the case member, an electrical connection will be achieved by means of the direct contact between the electronic equipment support member and the case member, and thus the structure can be simplified while reliably obtaining both a grounding effect and an electromagnetic wave shielding effect. Furthermore, it is possible to decrease the number of parts and assembly steps, and thus allow the low cost manufacture of electronic equipment. Thus, with the present invention, a superior ability to assemble electronic equipment, a secure connection between the electronic equipment support member and the case member, and superior electromagnetic wave shielding can be achieved in a good balance.

With the casing member for electronic equipment according to a seventh aspect of the present invention, the casing member of the first aspect is formed so that when the electronic equipment support member is mounted in the casing member, the amount of overlap with contacting portions of the opening periphery and the connection periphery is set to be in a range between 3 and 10 mm.

With this casing structure, because the amount of overlap due to contact between the opening periphery and the connection periphery is set to be in the aforementioned optimal range, a sufficient grounding effect can be obtained, and thus an optimal electromagnetic wave shielding effect can be provided. In addition, with the aforementioned amount of overlap, assembly will also be simplified because the electronic equipment support member can be securely mounted in the case member without undue effort. Thus, with the present invention, a superior ability to assemble electronic equipment, a secure connection between the electronic equipment support member and the case member, and superior electromagnetic wave shielding can be achieved in a good balance.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure:

FIG. 10A.

DETAILED DESCRIPTION OF THE PREFERRED EMBODIMENTS

Embodiments of the present invention will be described below with reference to the figures.

Figure 1:
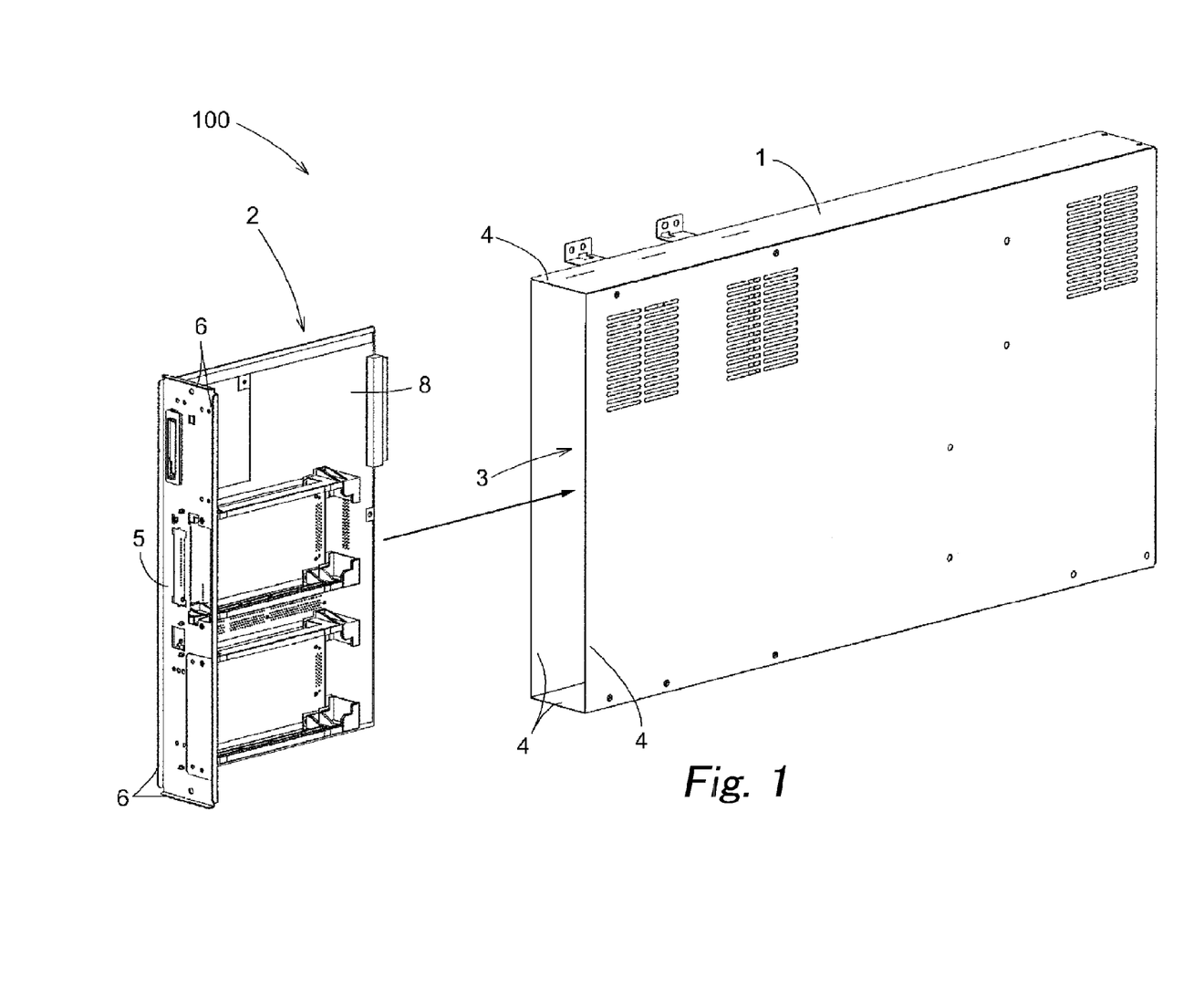
FIG. 1 is an oblique view of a casing structure for electronic equipment of the present invention.

FIG. 1 is an oblique view of a casing structure 100 for electronic equipment. The casing structure 100 includes a case member 1, and an electronic equipment support member 2. The case member 1 includes an opening 3, and the electronic equipment support member 2 is mounted on an opening periphery 4 of the opening 3. Note that in FIG. 1, the electronic equipment support member 2 is shown before being mounted in the case member 1.

Figure 2:
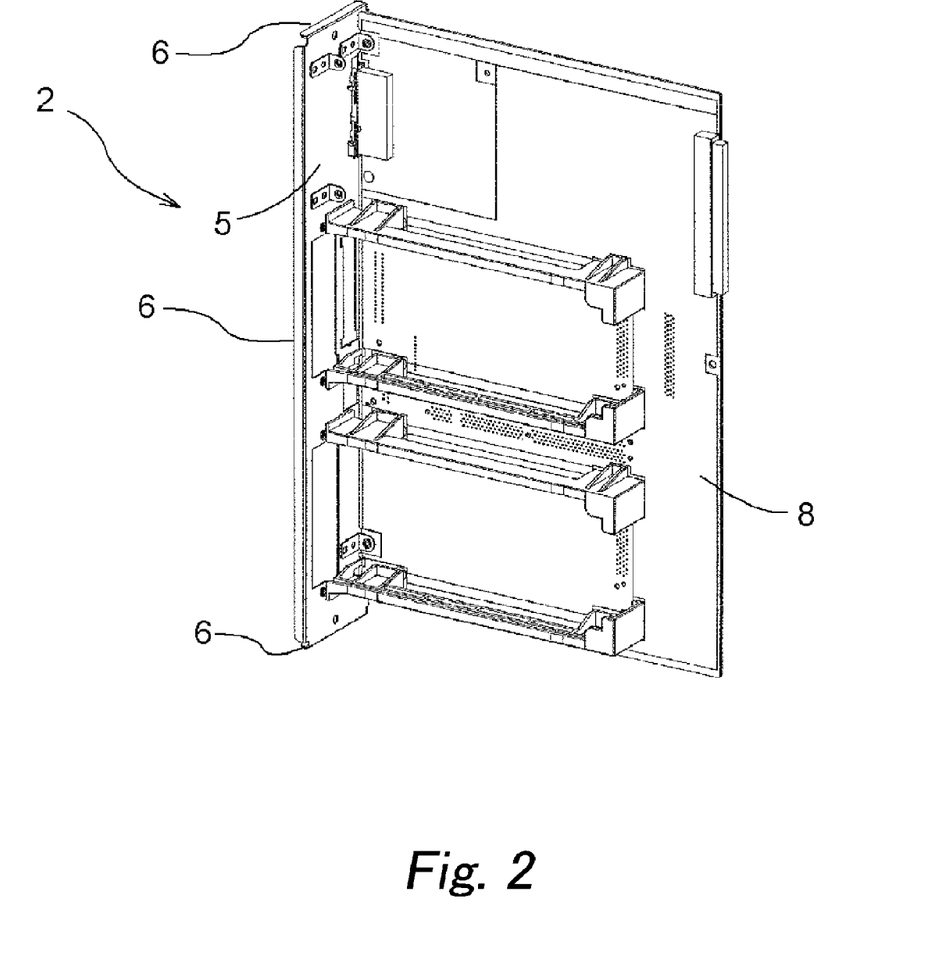
FIG. 2 is an oblique view of an electronic equipment support member.

FIG. 2 is an oblique view of the electronic equipment support member 2. An electronics mounting board 8 is arranged on the electronic equipment support member 2, and a variety of devices can be installed on the electronics mounting board 8.

Figure 3:
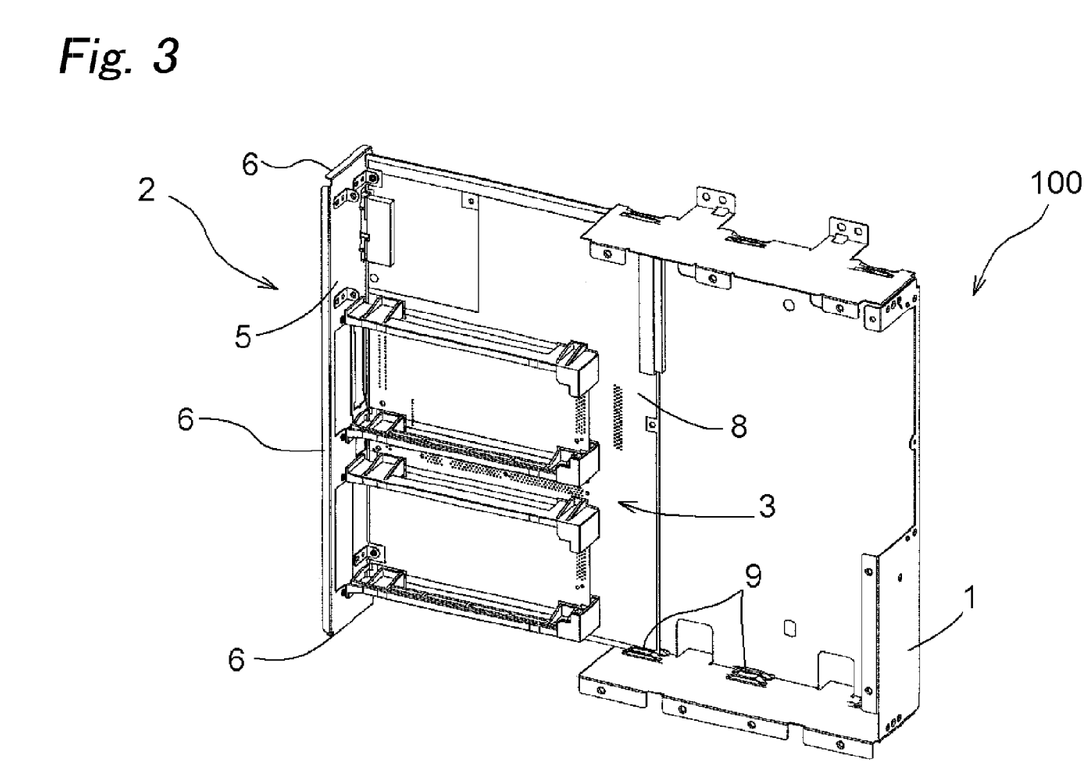
FIG. 3 is an oblique view showing a state when the electronic device support member is to be mounted in the interior of a case member.

FIG. 3 is an oblique view showing the electronic device support member 2 as it is being mounted in the interior of the case member 1. The electronic device support member 2 is pushed into the interior of the case member 1 by sliding the electronics mounting board 8 of the electronic device support member 2 on guides 9 installed in the interior of the case member 1.

Figure 4:
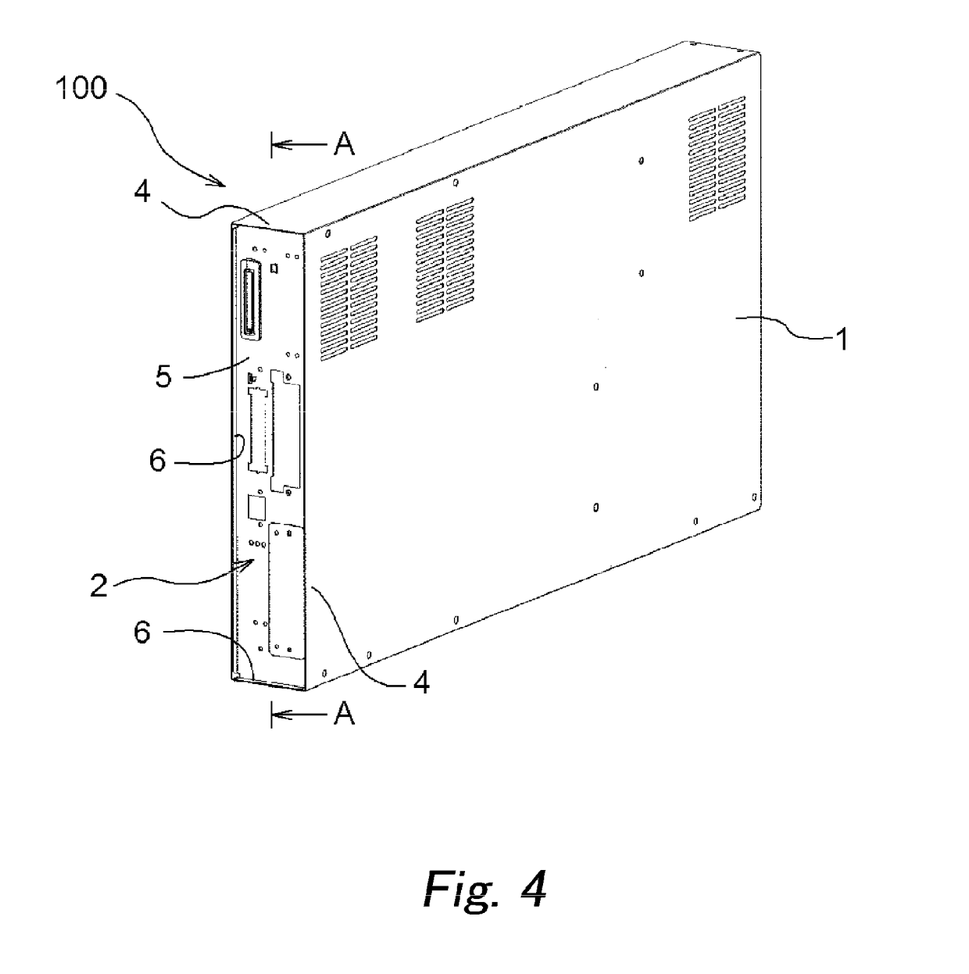
FIG. 4 is an oblique view showing a state when the electronic equipment support member is completely mounted in the case member.

Furthermore, FIG. 4 is an oblique view showing the electronic equipment support member 2 completely mounted in the case member 1. In the mounting state shown in FIG. 4, the electronic equipment support member 2 and the case member 1 are in contact with each other, and can both cooperate to produce an electromagnetic shielding effect.

The electronic equipment support member 2 includes an opening shielding portion 5 that closes the opening 3 of the case member 1 when mounted in the case member 1, and a mounting periphery 6 that is bent from the opening shielding portion 5 to extend along the opening periphery 4 of the case member 1. The angle formed between the opening shielding portion 5 and the mounting periphery 6 is obtuse. A more detailed description of this configuration will be provided below.

Figure 5:
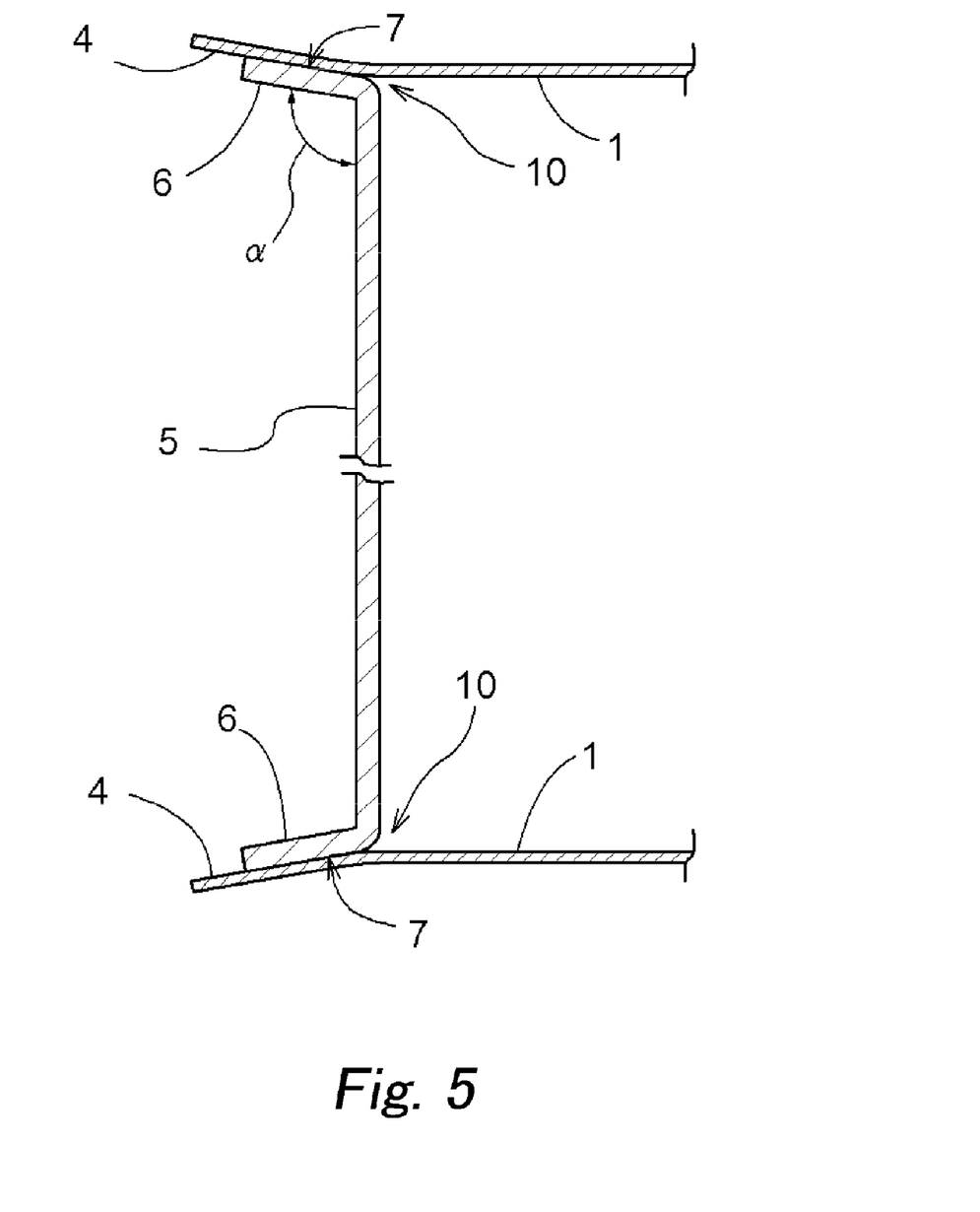
FIG. 5 is a partial cross-sectional view along line A—A of the casing structure of FIG. 4.

FIG. 5 is a partial cross-sectional view along line A—A of the casing structure 100 shown in FIG. 4. In FIG. 5, the angle formed between the opening shielding portion 5 and the mounting periphery 6 of the electronic equipment support member 2 is represented by $\alpha$. Here, the angle $\alpha$ may be any obtuse angle, but it is preferable that the angle $\alpha$ be greater than 90 degrees and less than 100 degrees. If the angle $\alpha$ is within this range, the electronic equipment support member 2 can slide with respect to the case member 1 and be mounted without undue effort, and the mounting periphery 6 of the electronic equipment support member 2 will be pressed into the case member 1 when mounting is complete. Thus, fixing means such as screws and the like need not be employed, and even if employed, the electronic equipment support member 2 can be securely fixed with the minimum number of fixing means needed. Also, when the mounting periphery 6 is pressed into the case member 1, an electrical connection will be achieved by means of the direct contact between the electronic equipment support member 2 and the case member 1, and thus the structure can be simplified while reliably obtaining both a grounding effect and an electromagnetic wave shielding effect. Furthermore, it is possible to decrease the number of parts and manufacturing steps, and thus allow the low cost manufacture of electronic equipment.

When the electronic equipment support member 2 is mounted in the case member 1, the electronic equipment support member 2 must also include, on at least a portion of the mounting periphery 6, a connection periphery 7 that is in direct contact with the opening periphery 4 of the case member 1 and electrically connected therewith. In order to achieve electromagnetic wave shielding characteristics, it will be sufficient if the electronic equipment support member 2 is in electrical contact with at least one portion of the opening periphery 4 of the case member 1. However, it is preferable that the entire mounting periphery 6 forms the connection periphery 7, because the connection between the electronic equipment support member 2 and the case member 1 will be more secure, and a sufficient electromagnetic wave shielding effect can be obtained.

If the entire mounting periphery 6 does not form the connection periphery 7, a periphery separation portion 10 can be arranged on a portion of the mounting periphery 6 so as to have a gap that is within a range capable of shielding electromagnetic waves between the periphery separation portion 10 and the opening periphery 4 when the electronic equipment support member 2 is mounted in the case member 1. In this configuration, the connection periphery 7 is bent from the opening shielding portion 5 toward the exterior of the case member 1. The periphery separation portion 10 can, for example, be arranged in the four corners of the opening shielding portion 5 shown in FIG. 4.

Figure 6:
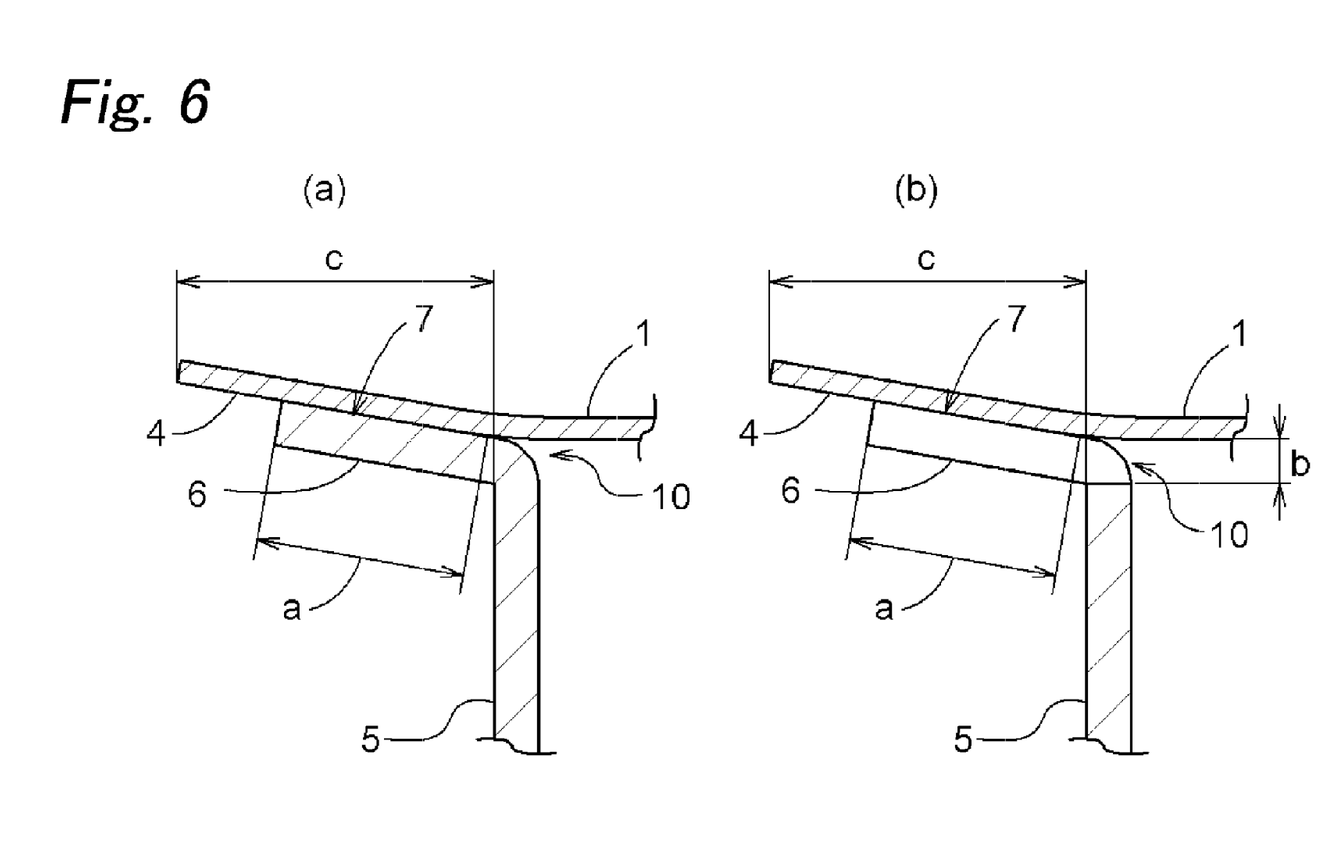
FIG. 6 is a cross-sectional view of a connection periphery and a periphery separation portion.

FIG. 6(*a*) shows a cross-sectional view of the connection periphery 7, and FIG. 6(*b*) shows a cross-sectional view of the periphery separation portion 10. In FIG. 6(*a*), the width of the connection periphery 7 is restricted to the area in which the electronic equipment support member 2 and the case member 1 overlap, and if it is assumed that the overlap amount is a, then the overlap amount a is preferably in the range from 3 to 10 mm. If the overlap amount a is in this range, a sufficient grounding effect between the electronic equipment support member 2 and the case member 1 can be obtained, and thereby provide the optimal electromagnetic shielding effect. In addition, assembly will also be simplified because the electronic equipment support member 2 can be securely mounted in the case member 1 without undue effort. Thus, with the present invention, a superior ability to assemble electronic equipment, a secure connection between the electronic equipment support member 2 and the case member 1, and superior electromagnetic wave shielding can be achieved in a good balance.

In addition, in FIG. 6(*b*), a separation gap b between the opening periphery 4 and the periphery separation portion 10 is preferably between about 0.5 and about 1.0 mm, and an opening distance c from the outer side end of the opening periphery 4 to the point at which the opening shielding portion 5 curves downward is preferably 3 mm or greater. If the separation gap b and the opening distance c are as described above, leakage of electromagnetic waves from the periphery separation portion 10 to the exterior of the electronic equipment can be almost totally prevented.

OTHER EMBODIMENTS

Next, several other configurations will be shown as other embodiments of the present invention.

Figure 7:
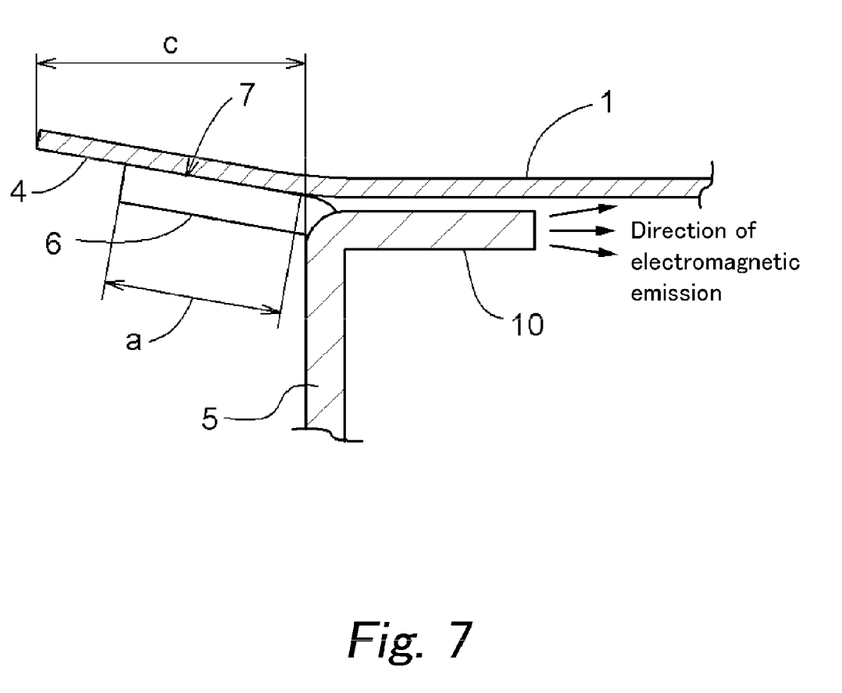
FIG. 7 is a cross-sectional view of the periphery separation portion formed by bending from an opening shielding portion toward the interior of the case member.

FIG. 7 is an example of an electronic equipment support member 2 having a mounting periphery 6 and a periphery separation portion 10. With this configuration, if the angle formed by the opening shielding portion 5 and the mounting periphery 6 is obtuse, and the periphery separation portion 10 is bent inward from the opening shielding portion 5 toward the interior of the case member 1, the periphery separation portion 10 will become an antenna and the electromagnetic waves can radiate toward the interior of the case member 1. Thus, unnecessary electromagnetic waves will all be absorbed inside the case member 1, and leakage to the exterior of the case member 1 can be further reduced.

Figure 8:
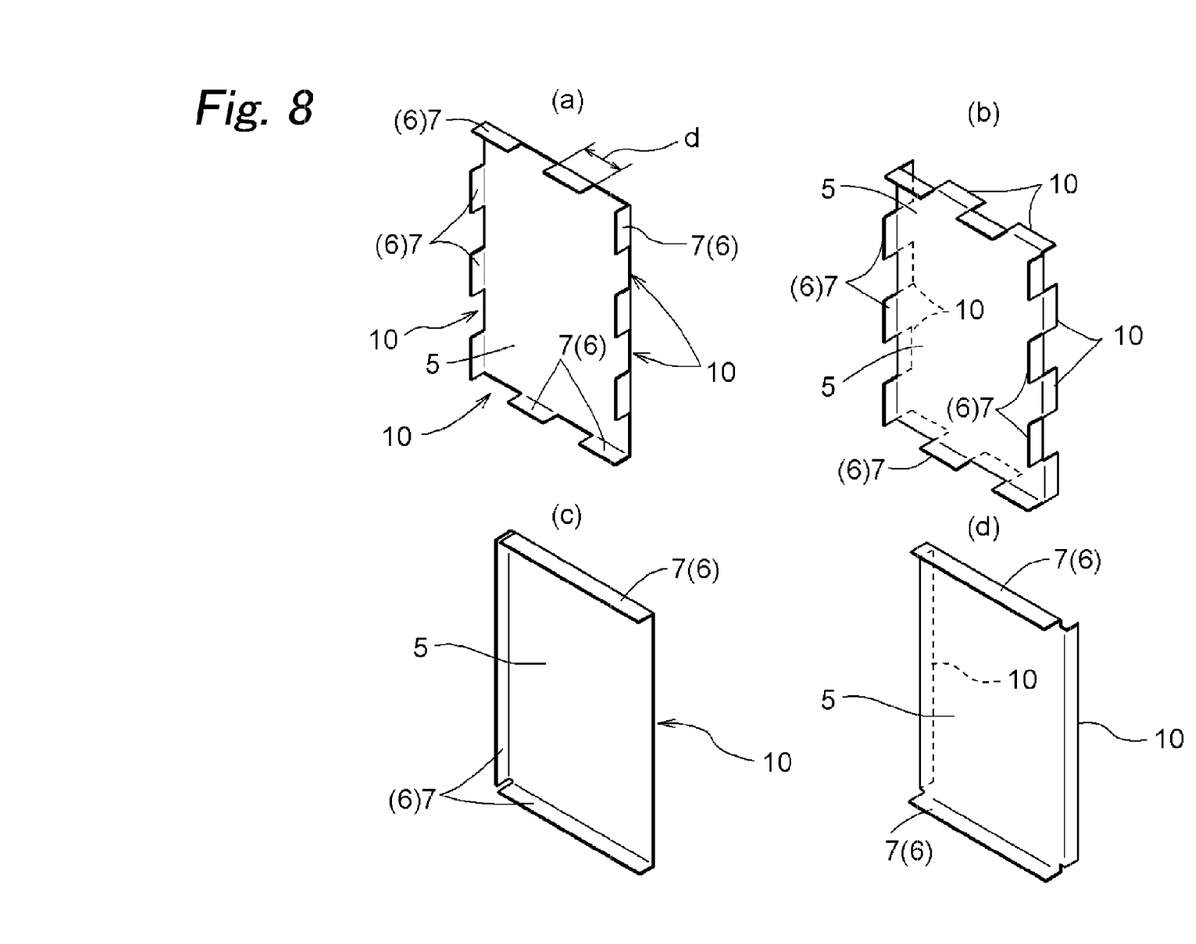
FIG. 8 shows other examples of the configuration of the mounting periphery of an electronic equipment support member having a connection periphery and a periphery separation portion.

In FIG. 8(*a*) to 8(*d*), other configurations are shown in which the mounting periphery 6 of the electronic equipment support member 2 having connection peripheries 7 and peripheral separation portions 10 are schematically represented. With these configurations, the grounding layout between the case member 1 and the electronic equipment support member 2 can conform the electromagnetic shielding capability required by the electronic equipment with the shape of the case member and allow the design to be optimized, and can simplify the assembly of the case member 1 and the electronic equipment support member 2. For example, as shown in FIG. 8(*a*), if the connection peripheries 7 are a portion of the mounting periphery 6, it is preferable that the width d thereof be at least about 10 mm. If the width d is about 10 mm, the electromagnetic wave shielding effect will be maintained while making it possible to fix the electronic equipment support member 2 to the case member 1. If one wants to fix the electronic equipment support member 2 more securely, the width of the connection periphery 7 may be made larger, or a plurality of connection peripheries 7 may be provided at a plurality of symmetrical locations.

In addition, the casing structure 100 for electronic equipment will normally have a cube or rectangular shape. With a casing structure having one of these shapes, the opening shielding portion 5 of the electronic equipment support member 2 will have a square or rectangular shape. With a square or rectangular opening shielding portion 5, the electronic equipment support member 2 can be fixed to the case member 1 if the mounting periphery 6 is arranged on at least 2 sides thereof that face each other.

Thus, with the present invention, the structure can be simplified, the electronic equipment support member 2 can be accurately positioned, and a securely fixed and superior electromagnetic shield can be achieved.

As described above, according to the casing structure of the present invention, fixing means such as screws or the like need not be employed, and even if fixing means are employed, the electronic equipment support member can be easily fixed to the casing member with the minimum number of fixing means necessary, and thus can provide low cost electronic equipment in which the number of parts and the number of assembly steps are reduced. Electronic equipment which has adopted the casing structure of the present invention can have a simplified structure, and can obtain a sufficient electromagnetic wave shielding effect.

Examples of the present invention, and comparative examples to these examples, are disclosed below in which in which the electromagnetic wave shielding effect provided by the casing structure was measured.

EXAMPLE 1

A casing structure used in a tandem type color copying machine that is substantially the same as the casing structure shown in FIG. 1 was employed, and an electromagnetic wave shielding test was performed. A mounting periphery of an electronic equipment support member was made into a connection periphery in which four portions thereof were bent into an obtuse angle from the opening shielding portion toward the exterior of the case member. The overlap amount a between the electronic equipment support member and the case member of this example was 5 mm, and the opening distance c was 6 mm. An EMI measurement antenna was erected in an anechoic chamber 3 meters away from the casing member of the present example, the emission noise level (30–230 MHz) during movement was measured, and the target level was found to be below approximately 10 dB.

EXAMPLE 2

Connection peripheries each having a width of 10 mm were provided at two points along the two long sides of the mounting periphery of the electronic equipment support member, and the other portions of the mounting periphery were made into unbent periphery separation portion. In addition, the separation gap b between the opening periphery of the case member and the periphery separation portion was 0.5 mm. Other conditions were the same as those of Example 1. The same electromagnetic wave shielding test as in Example 1 was performed on the casing structure of this example, and although the emission noise level increased approximately 5 dB, this level was within the target level.

EXAMPLE 3

The unbent periphery separation portions in Example 2 were made into periphery separation portions having a length of 5 mm, and were bent from the opening shielding portion of the electronic equipment support member in FIG. 7 inward toward the interior of the case member. The other conditions were the same as those in Example 2, and the same electromagnetic wave shielding test was performed. The result of the test was that the emission noise level declined approximately 5 dB. This electromagnetic wave shielding effect was an improvement over that of Example 2, and was at approximately the same level as that of Example 1.

EXAMPLE 4

Figure 9:
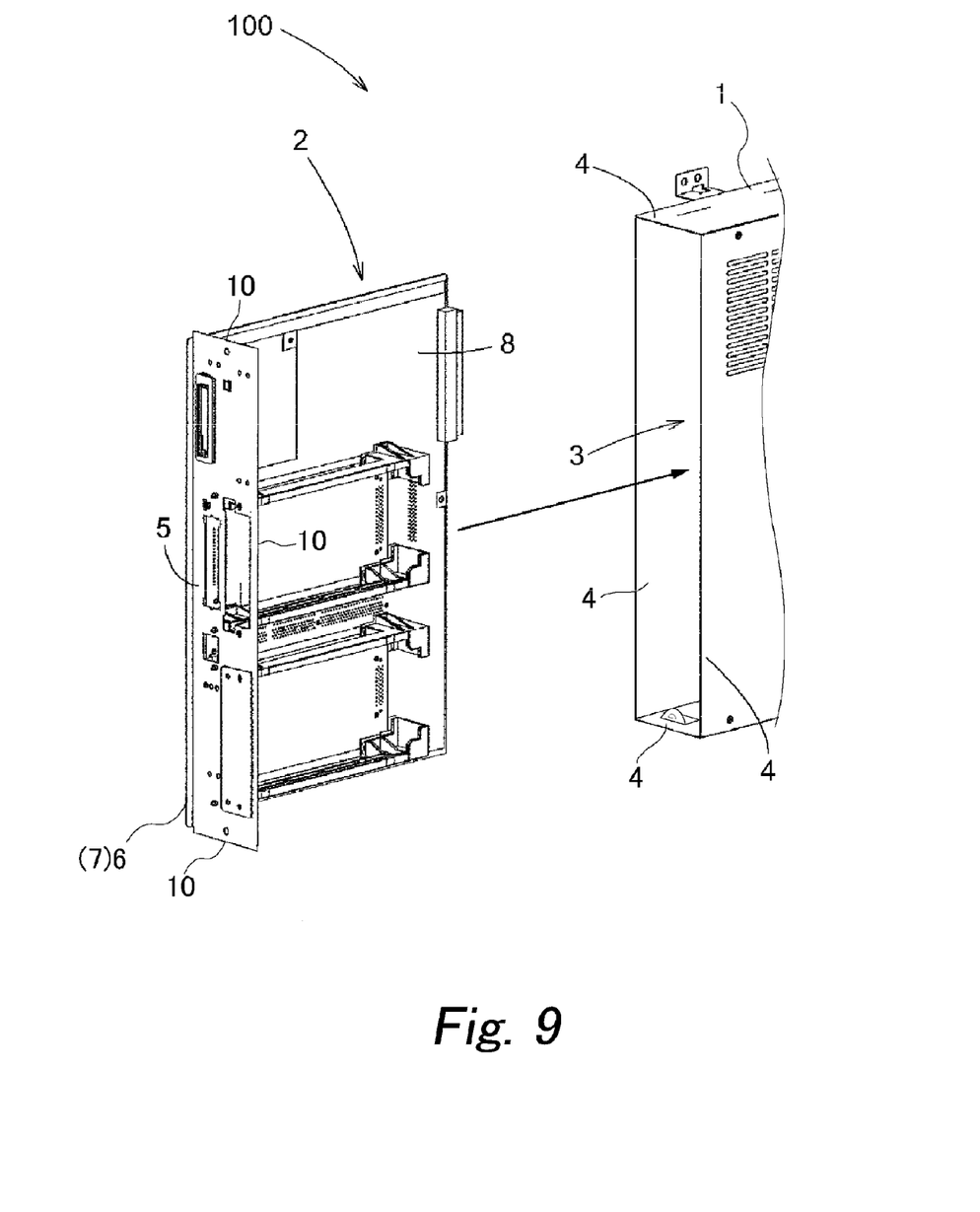
FIG. 9 shows another example of the electronic device support member.
Figure 10A:
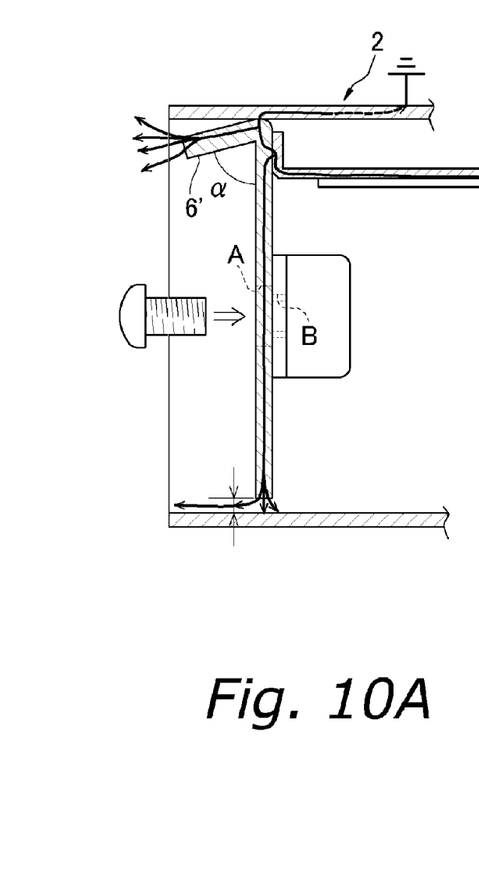
Figure 10B:
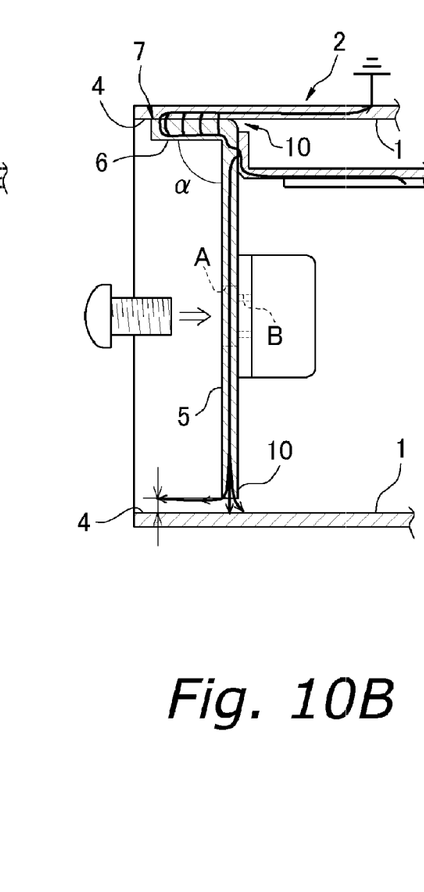
FIG. 10B and FIG. 10C shows various configurations of the electronic device support member shown in FIG. 9.
Figure 10C:
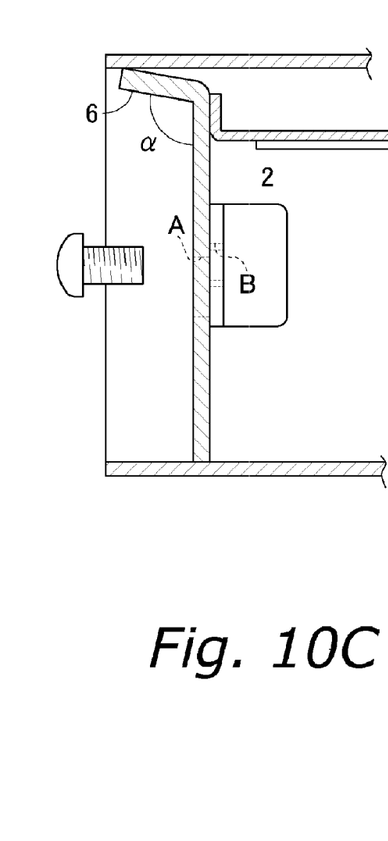

FIGS. 9 and 10 show a configuration in which one side of the mounting periphery 6 of the electronic equipment support member 2 was made into a connection periphery that was bent into a right angle from the opening shielding portion 5 toward the exterior of the case member 1, and the other portions of the mounting periphery 6 were made into unbent periphery separation portions. The overlap amount a between the electronic equipment support member 2 and the case member 1 was 5 mm, the opening distance was 6 mm, and the separation gap b between the opening periphery of the case member 1 and the periphery separation portion was 2.0 mm. The same electromagnetic wave shielding test as in the aforementioned examples was performed in an anechoic chamber. The emission noise level was a number of dB above the target level, but still below an unacceptable level.

In this example, there is only one mounting periphery 6 on the opening shielding portion 5, and thus fastening members such as screws or the like may be needed to fix the electronic equipment support member 2 to the case member 1. As can be seen in FIG. 9, two fastening holes A are formed in the upper and lower portions of the opening shielding portion 5, and two fastening projections which each have a fastening hole B formed therein are arranged on the upper and lower portions of the opening periphery 4 of the case member 1. The electronic equipment support member 2 can be fixed to the case member 1 by threading a screw into each combination of fastening holes A and B.

FIG. 10 shows three different configurations of the electronic equipment support member 2 mounted on the case member 1. FIG. 10(a) shows a configuration in which a single mounting periphery 6' is bent into an acute angle, the edge of the electronic equipment support member 2 on the opposite side of the mounting periphery 6' is spaced apart from the case member 1 by 2 mm, and the fastening holes A and B are in alignment with each other. FIG. 10(b) shows a configuration in which the mounting periphery 6 is bent into a right angle, the edge of the electronic equipment support member 2 on the opposite side of the mounting periphery 6 is spaced apart from the case member 1 by 2 mm, and the fastening holes A and B are in alignment with each other. FIG. 10(c) shows a configuration in which the mounting periphery 6 is bent into an obtuse angle, the edge of the electronic equipment support member 2 on the opposite side of the mounting periphery 6 is in contact with the case member 1, and the fastening holes A and B are out of alignment with each other.

The configuration shown in FIG. 10(a) allows the electronic equipment support member 2 to be easily mounted in the case member 1, but will produce electromagnetic noise on both the end of the mounting periphery 6' and on the edge of the electronic equipment support member 2 on the opposite side of the mounting periphery 6'. The level of electromagnetic noise produced in this configuration will be at or above an unacceptable level.

In contrast, the right angled mounting periphery 6 shown in FIG. 10(b) will only produce electromagnetic noise on the edge of the electronic equipment support member 2 on the opposite side of the mounting periphery 6, but not on the end of the mounting periphery 6. Although there is some electromagnetic noise produced in this configuration, it will be below an unacceptable level. In addition, this configuration allows the electronic equipment support member 2 to be easily mounted in the case member 1.

The obtuse angled mounting periphery 6 shown in FIG. 10(c) will produce electromagnetic noise that is below an unacceptable level. However, because the fastening holes A and B are out of alignment with each other in the configuration shown in FIG. 10(c), a screw cannot be passed through these holes, and thus it will be quite difficult to mount the electronic equipment support member 2 in the case member 1.

Thus, it can be seen from the above description that compared to the configurations shown in FIGS. 10(a) and 10(c), the configuration shown in FIG. 10(b) provides both easy mounting and a reduction in electromagnetic noise.

Note that the right angle configuration described in this example can be applied to any of the other mounting peripheries 6 described above. For example, when the opening shielding portion 5 has more than one mounting periphery 6, some or all of these mounting peripheries 6 can have a right angle configuration instead of an obtuse angle configuration.

COMPARATIVE EXAMPLE 1

The electronic equipment support member was concealed from the exterior of the case member with an outer lid shape, and screws were employed at two locations to fix the electronic equipment support member to the case member. The same electromagnetic wave shielding test as in the aforementioned examples was performed in an anechoic chamber, and the emission noise level was 5 to 10 dB above the target level.

Any terms of degree used herein, such as "substantially", "about" and "approximately", mean a reasonable amount of deviation of the modified term such that the end result is not significantly changed. These terms should be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention are provided for illustration only, and not for the purpose of limiting the invention as defined by the appended claims and their equivalents.

What is claimed is:

1. A casing structure for electronic equipment, comprising:
    a case member having an opening; and
    an electronic equipment support member that is mounted in an opening periphery of the case member, comprised of an opening shielding portion that closes the opening of the case member and a mounting periphery that is bent from the opening shielding portion along the opening periphery;
    wherein an angle formed between the opening shielding portion and the mounting periphery of the electronic equipment support member is 90 degrees or greater; and
    at least one portion of the mounting periphery includes a connection periphery that is electrically connected to the opening periphery of the case member when the electrical equipment support member is mounted in the case member.

2. The casing structure for electronic equipment set forth in claim 1, wherein the mounting periphery comprises the connection periphery, and a periphery separation portion arranged so as to form a gap between the periphery separation portion and the opening periphery that is sized to be within a range that can shield electromagnetic waves when the electrical equipment support member is mounted in the case member;
    wherein the connection periphery is bent outward from the opening shielding portion toward an exterior of the case member.

3. The casing structure for electronic equipment set forth in claim 2, wherein the periphery separation portion is bent inward from the opening shielding portion toward an interior of the case member.

4. The casing structure for electronic equipment set forth in claim 1, wherein the entire mounting periphery is the connection periphery.

5. The casing structure for electronic equipment set forth in claim 1, wherein the opening of the case member is be formed into a rectangular shape;
    the opening shielding portion that closes the opening of the case member is formed into a rectangular shape; and
    the mounting periphery is arranged on at least two sides of the opening shielding portion.

6. The casing structure for electronic equipment set forth in claim 1, wherein the angle is in a range between 90 and 100 degrees.

7. The casing structure for electronic equipment set forth in claim 1, wherein when the electronic equipment support member is mounted in the casing member, the amount of overlap with contacting portions of the opening periphery and the connection periphery is set to be in a range between 3 and 10 millimeters.

* * * * *